United States Patent
Aoki

(10) Patent No.: US 7,638,821 B2
(45) Date of Patent: Dec. 29, 2009

(54) INTEGRATED CIRCUIT INCORPORATING DECOUPLING CAPACITOR UNDER POWER AND GROUND LINES

(75) Inventor: Yasushi Aoki, Kanagawa (JP)

(73) Assignee: NEC Electronics Corporation, Tokyo (JP)

( * ) Notice: Subject to any disclaimer, the term of this patent is extended or adjusted under 35 U.S.C. 154(b) by 64 days.

(21) Appl. No.: 11/510,648

(22) Filed: Aug. 28, 2006

(65) Prior Publication Data
US 2007/0045770 A1    Mar. 1, 2007

(30) Foreign Application Priority Data
Aug. 31, 2005    (JP) .............................. 2005-252002

(51) Int. Cl.
*H01L 29/12* (2006.01)

(52) U.S. Cl. ................................ 257/204; 257/E27.108

(58) Field of Classification Search ................... 257/516
See application file for complete search history.

(56) References Cited

U.S. PATENT DOCUMENTS

| | | | | |
|---|---|---|---|---|
| 5,631,492 A | * | 5/1997 | Ramus et al. | 257/532 |
| 5,838,047 A | * | 11/1998 | Yamauchi et al. | 257/372 |
| 6,035,111 A | * | 3/2000 | Suzuki et al. | 716/11 |
| 6,339,235 B1 | * | 1/2002 | Takata | 257/208 |
| 6,467,070 B2 | * | 10/2002 | Kuroda et al. | 716/8 |
| 6,849,906 B2 | * | 2/2005 | Maeno et al. | 257/390 |

FOREIGN PATENT DOCUMENTS

| | | | |
|---|---|---|---|
| JP | 2-241061 A | | 9/1990 |
| JP | 2241061 | * | 9/1990 |

* cited by examiner

*Primary Examiner*—Wai-Sing Louie
*Assistant Examiner*—Bilkis Jahan
(74) *Attorney, Agent, or Firm*—Sughrue Mion, PLLC

(57) ABSTRACT

A semiconductor device is composed of: an array of CMOS primitive cells provided in a circuit region; a power supply line extended along the array of the CMOS primitive cells and connected to the CMOS primitive cells; a ground line extended along the array of the CMOS primitive cells and connected to the CMOS primitive cells; a first decoupling capacitor provided under the power supply line; a second decoupling capacitor provided under the ground line. The first decoupling capacitor is formed of a PMOS transistor having a gate connected to the ground line. At least one of the source and drain of the PMOS transistor is connected to the power supply line. The second decoupling capacitor is formed of an NMOS transistor having a gate connected to the power supply line. At least one of the source and drain of the NMOS transistor is connected to the ground line.

1 Claim, 12 Drawing Sheets

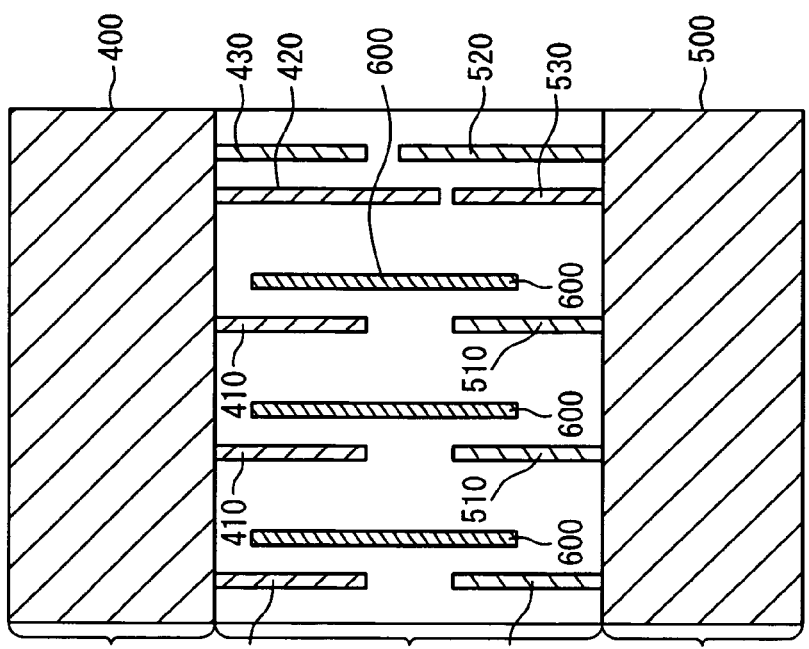
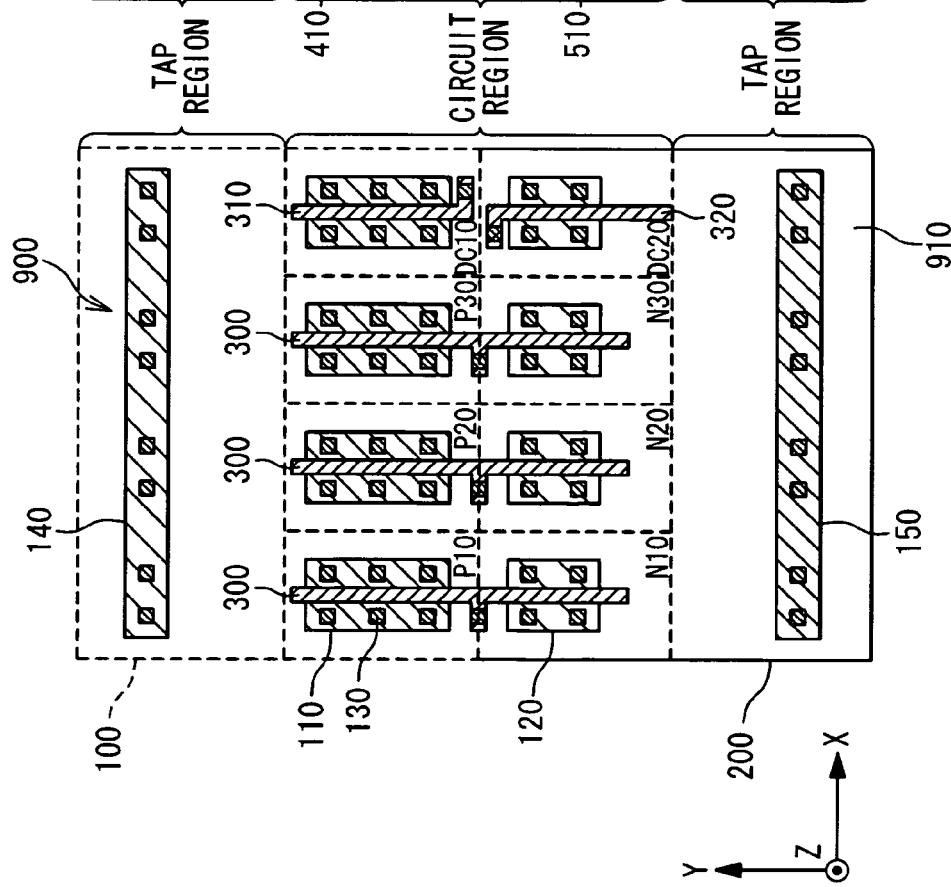

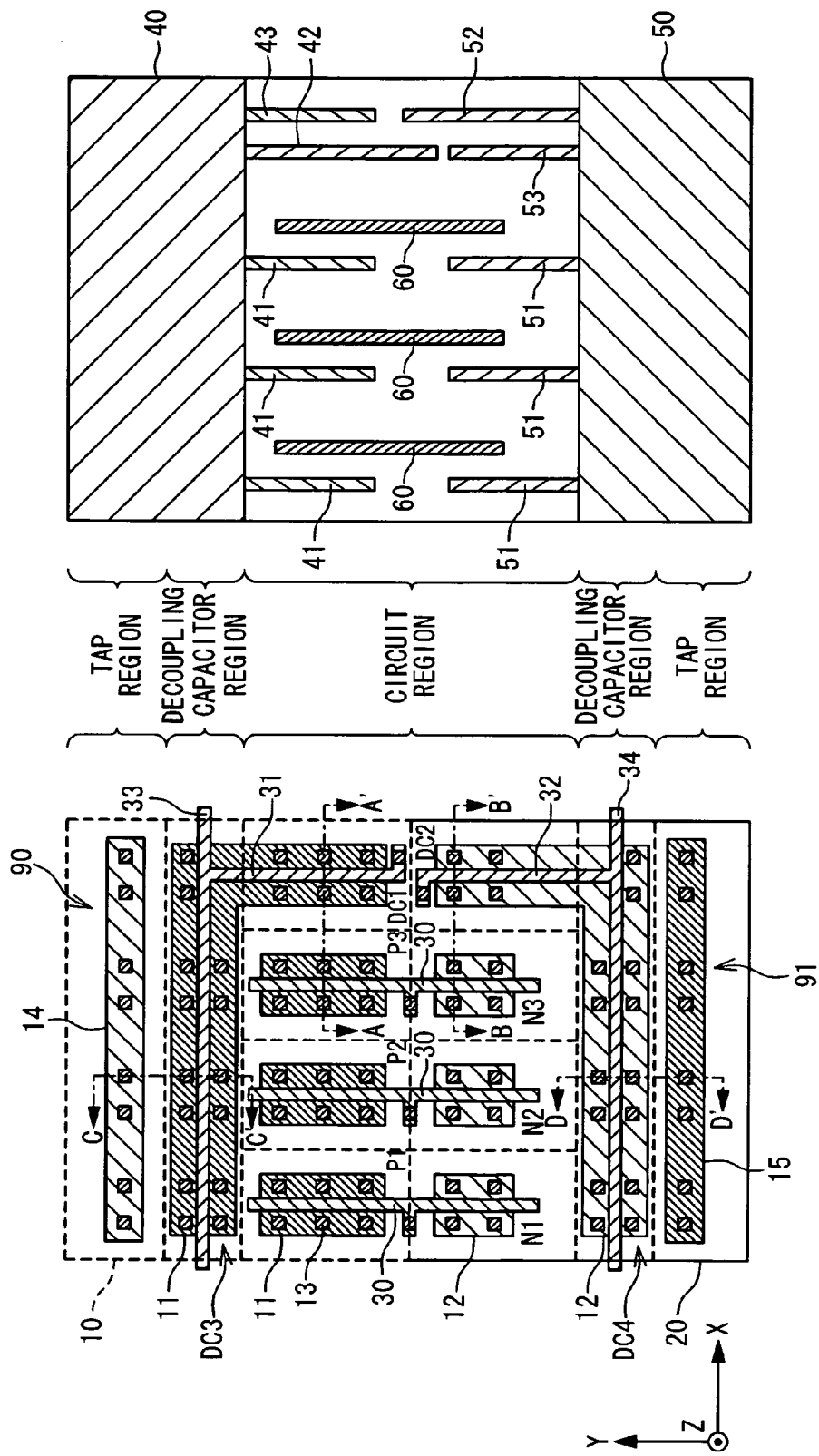

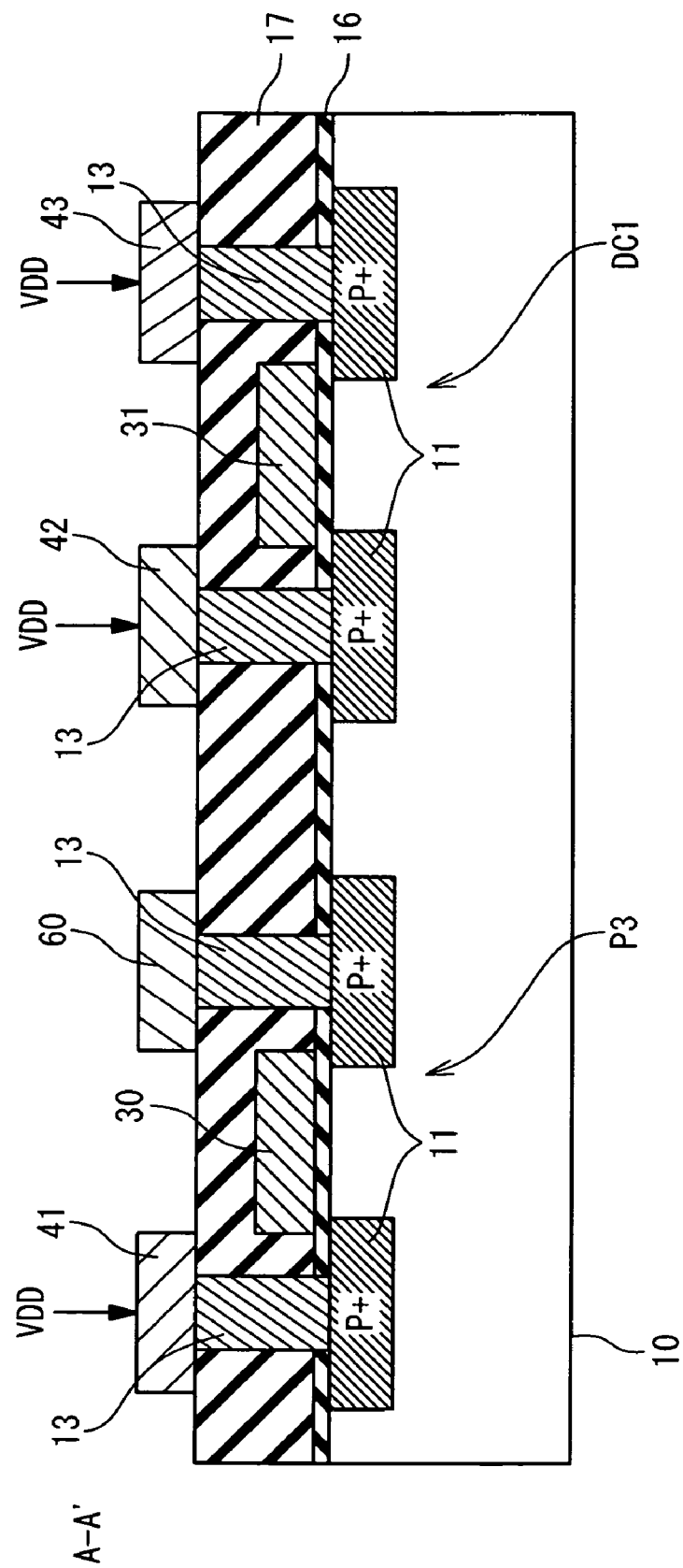

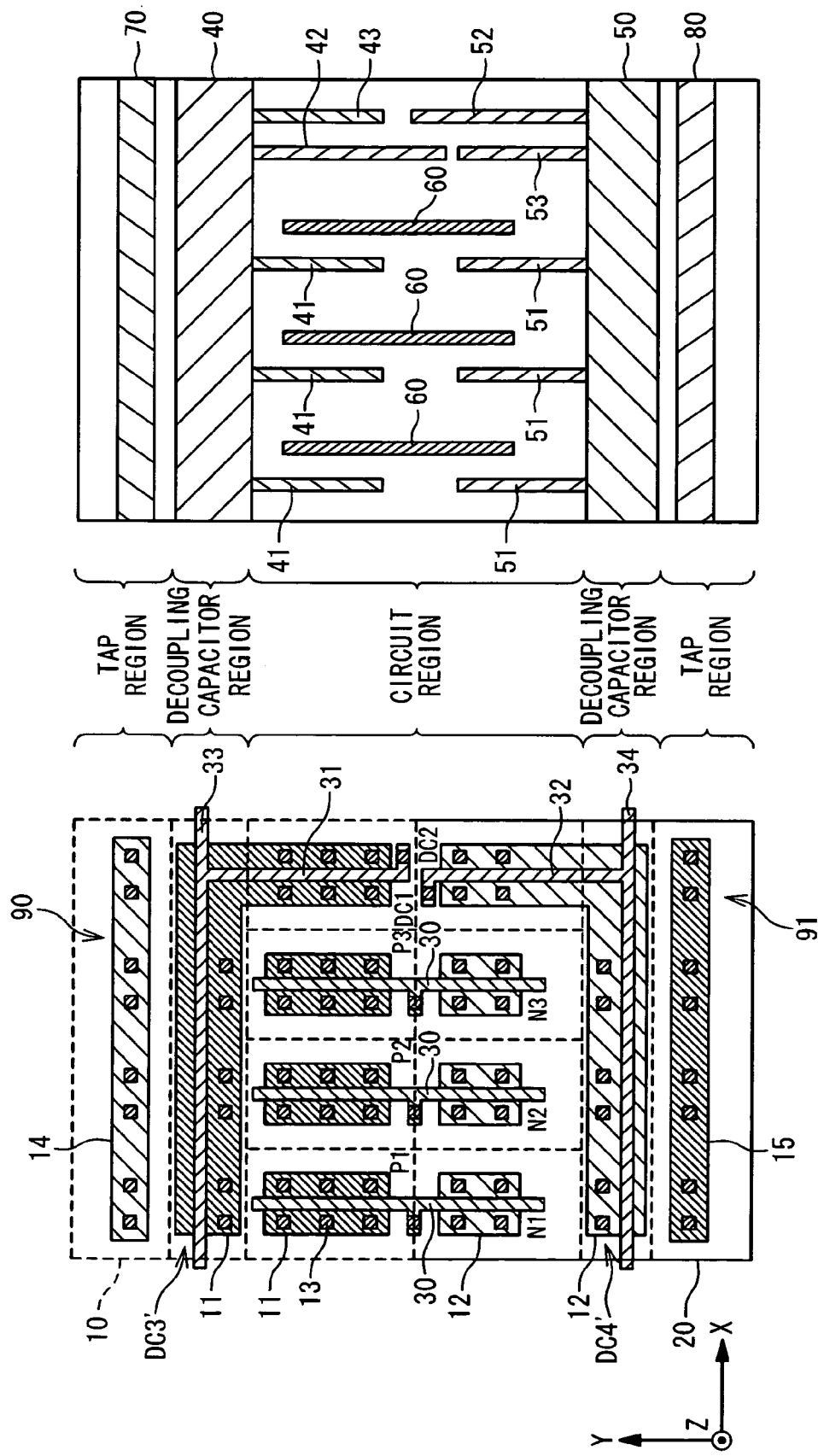

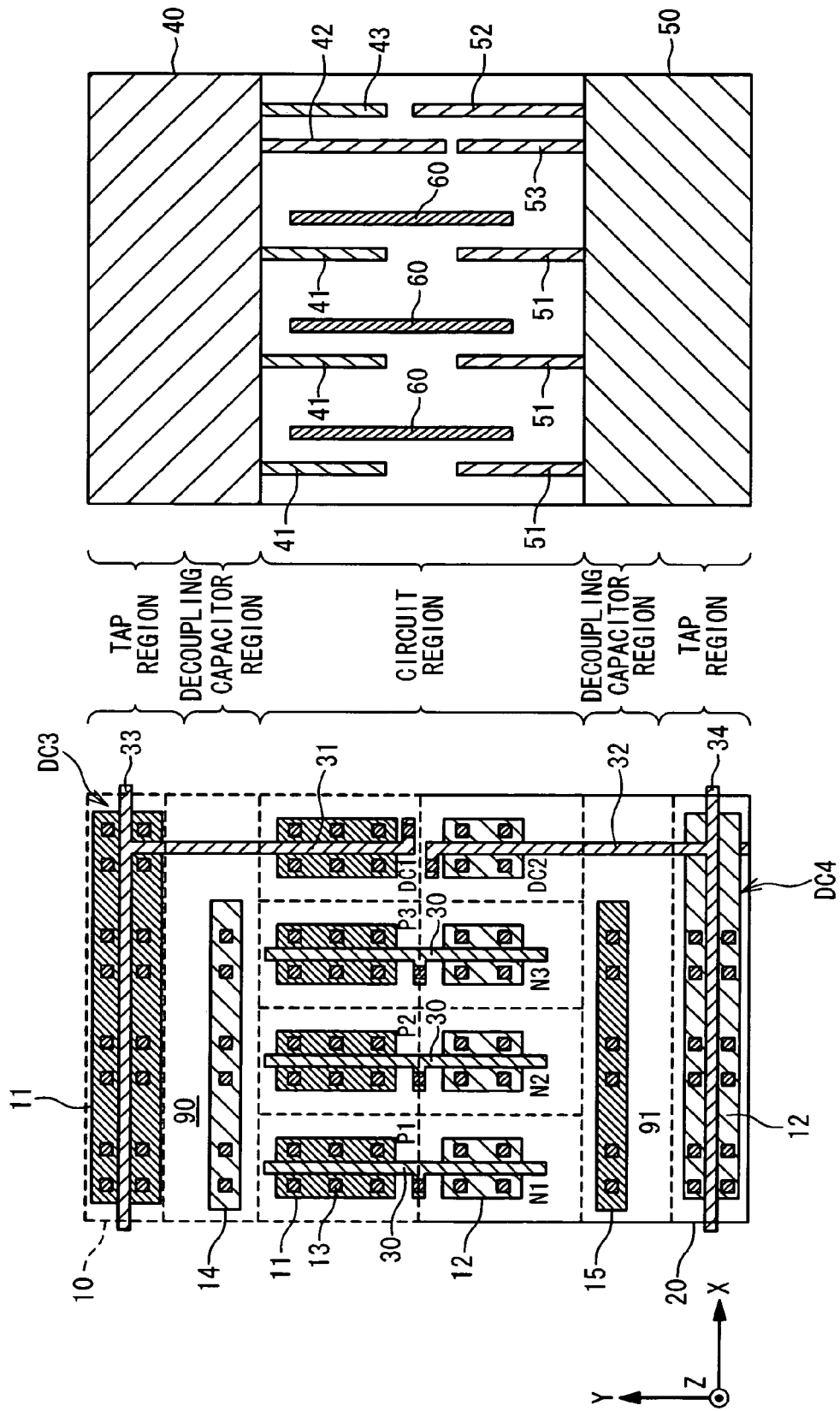

INTEGRATED CIRCUIT INCORPORATING DECOUPLING CAPACITOR UNDER POWER AND GROUND LINES

BACKGROUND OF THE INVENTION

1. Field of the Invention

The present invention is related to a semiconductor device, particularly, to a cell base integrated circuit incorporating CMOS (complementary metal oxide semiconductor) primitive cells.

2. Description of the Related Art

Avoiding malfunction and decrease in the operating speed due to power supply noise is one of the requirements of LSI's (large scale integrated circuit) incorporating CMOS primitive cells, especially LSI's in which analogue and digital circuits are monolithically integrated. Therefore, LSI's often incorporate a decoupling capacitor for several primitive cells to thereby improve tolerance to the power supply noise.

Japanese Laid Open Patent Application No. Jp-A Heisei 2-241061 discloses a CMOS gate array incorporating bypass capacitors (decoupling capacitors) between the power supply and ground to absorb the noise. The disclosed CMOS gate array includes an array of primitive cells each comprised of a PMOS transistor(s) and an NMOS transistor(s). In this CMOS gate array, decoupling capacitors are prepared by using unused transistors within the primitive cells. Specifically, the source and drain of an unused PMOS transistor within a primitive cell is connected to a power supply line, and the gate thereof is connected to a ground line. Correspondingly, the source and drain of an unused NMOS transistor within a primitive cell is connected to a ground line, and the gate thereof is connected to a power supply line. Such connection allows the unused PMOS and NMOS transistors to function as decoupling capacitors.

FIGS. 1A and 1B illustrate an exemplary layout of primitive cells and decoupling capacitors disclosed in the above-described Patent Application. In detail, FIG. 1A illustrates layouts of a well layer, a diffusion layer, a polysilicon layer, and a contact layer, which are integrated within or on the substrate, and FIG. 1B illustrates a metal interconnection layer integrated on or over these layers.

Referring to FIG. 1A, the conventional CMOS array is composed of a circuit region, and a pair of tap regions 900 and 910, which are used to stabilize the ground level of the transistors within the inverter cells and the decoupling capacitors. The circuit region incorporates multiple inverter cells (which are a sort of CMOS primitive cells) and a decoupling capacitor cell formed of unused PMOS and NMOS transistors within the circuit region. Referring to FIG. 1B, the metal interconnection layer is composed of a power supply line 400 connected to a power supply VDD, and a ground line 500 connected to the ground GND. The power supply line 400 and the ground line 500 are extended in the X-axis direction.

Integrated within the CMOS inverter cells are PMOS transistors P10, P20, P30, NMOS transistors N10, N20, and N30. The PMOS transistors P10, P20, and P30 include P-type diffusion layers 110 integrated within an N-type well 100, and the NMOS transistors N10, N20, and N30 include N-type diffusion layers 120 integrated within an P-type well 200. The PMOS transistors P10, P20, P30, NMOS transistors N10, N20, and N30 have commonly-connected gate electrodes 300, and the drains of the PMOS transistors P10, P20, P30, and the NMOS transistors N10, N20, N30 are commonly connected through interconnections 600. The sources of the PMOS transistors P10, P20, and P30 are connected to the power supply line 400 through via contacts 130 and interconnections 410, and the sources of the NMOS transistors N10, N20, and N30 are connected to the ground line 500 through the via contacts 140 and interconnections 510.

The tap region 900 is positioned under the power supply line 400. The tap region 900 includes an N-type diffusion layer 140 which provides an electrical connection of the N-well 100, within which the PMOS transistors P10, P20, and P30 are integrated, to the power supply VDD. The electric potential of the N-well 100 is stabilized by the electrical connection between the N-well 100 and the power supply VDD.

Correspondingly, the tap region 910 is positioned under the ground line 500. The tap region 910 include a P-type diffusion layer 150 which provides an electrical connection of the P-well 200, within which the NMOS transistors N10, N20, and N30 are integrated, to the ground GND. The electric potential of the P-well 200 is stabilized by the electrical connection between the P-well 200 and the ground GND.

The decoupling capacitor cell is composed of unused PMOS and NMOS transistors within the circuit region. Specifically, as shown in FIG. 1A, the decoupling capacitor cell is composed of a PMOS transistor DC10 and an NMOS transistor DC20. The PMOS transistor DC10 has a gate electrode 310 connected to the ground line 500 through an interconnection 520, and the NMOS transistor DC20 has a gate electrode 320 connected to the power supply line 400 through an interconnection 420. The source and drain of the PMOS transistor DC10 are connected to the power supply line 400 through via contacts 130, and interconnections 420 and 430, while the source and drain of the NMOS transistor DC20 are connected to the ground line 500 through via contacts 130 and interconnections 520 and 530. In this structure, the gate capacitances of the PMOS transistor DC10 and NMOS transistor DC20 are used as the decoupling capacitors, and thereby effectively suppress the power supply noise of the power supply VDD and the ground GND.

In the above-described conventional LSI, one decoupling capacitor cell is prepared for multiple primitive cells. The decoupling capacitors within the decoupling capacitor cell are formed of gate capacitances of unused transistors within the circuit region. Such device structure requires increased total gate areas for effectively suppressing the power supply noise. Therefore, the conventional LSI suffers from a problem that an increased number of decoupling capacitor cells are required to suppress the power supply noise to a desired degree, and therefore the chip size is undesirably increased.

SUMMARY OF THE INVENTION

In an aspect of the present invention, a semiconductor device is composed of: an array of CMOS primitive cells provided in a circuit region; a power supply line extended along the array of the CMOS primitive cells and connected to the CMOS primitive cells; a ground line extended along the array of the CMOS primitive cells and connected to the CMOS primitive cells; a first decoupling capacitor provided under the power supply line; a second decoupling capacitor provided under the ground line. The first decoupling capacitor is formed of a PMOS transistor having a gate connected to the ground line. At least one of the source and drain of the PMOS transistor is connected to the power supply line. The second decoupling capacitor is formed of an NMOS transistor having a gate connected to the power supply line. At least one of the source and drain of the NMOS transistor is connected to the ground line.

The semiconductor device in accordance with the present invention achieves effective suppression of the power supply noise with a reduced chip size, through making effective use of spaces under the power supply line and the ground line, which have an increased width for providing sufficient current capacity; the semiconductor device incorporates the decoupling capacitors under the spaces under the power supply line and the ground line.

Additionally, the semiconductor device effectively avoids the malfunction and operating speed reduction due to the power supply noise.

BRIEF DESCRIPTION OF THE DRAWINGS

The above and other advantages and features of the present invention will be more apparent from the following description taken in conjunction with the accompanied drawings, in which:

FIGS. 1A and 1B illustrate a layout of a conventional semiconductor device incorporating decoupling capacitors;

FIGS. 2A and 2B illustrate a layout of a semiconductor device in a first embodiment of the present invention;

FIG. 3 is a section view illustrating the structure of the semiconductor device on the A-A1 section indicated in FIG. 2A;

FIGS. 11A and 11B illustrate a layout of a semiconductor device in a third embodiment of the present invention; and FIGS. 12A and 12B illustrate a modified layout of a semiconductor device in accordance with the present invention.

DESCRIPTION OF THE PREFERRED EMBODIMENTS

Figure 4:
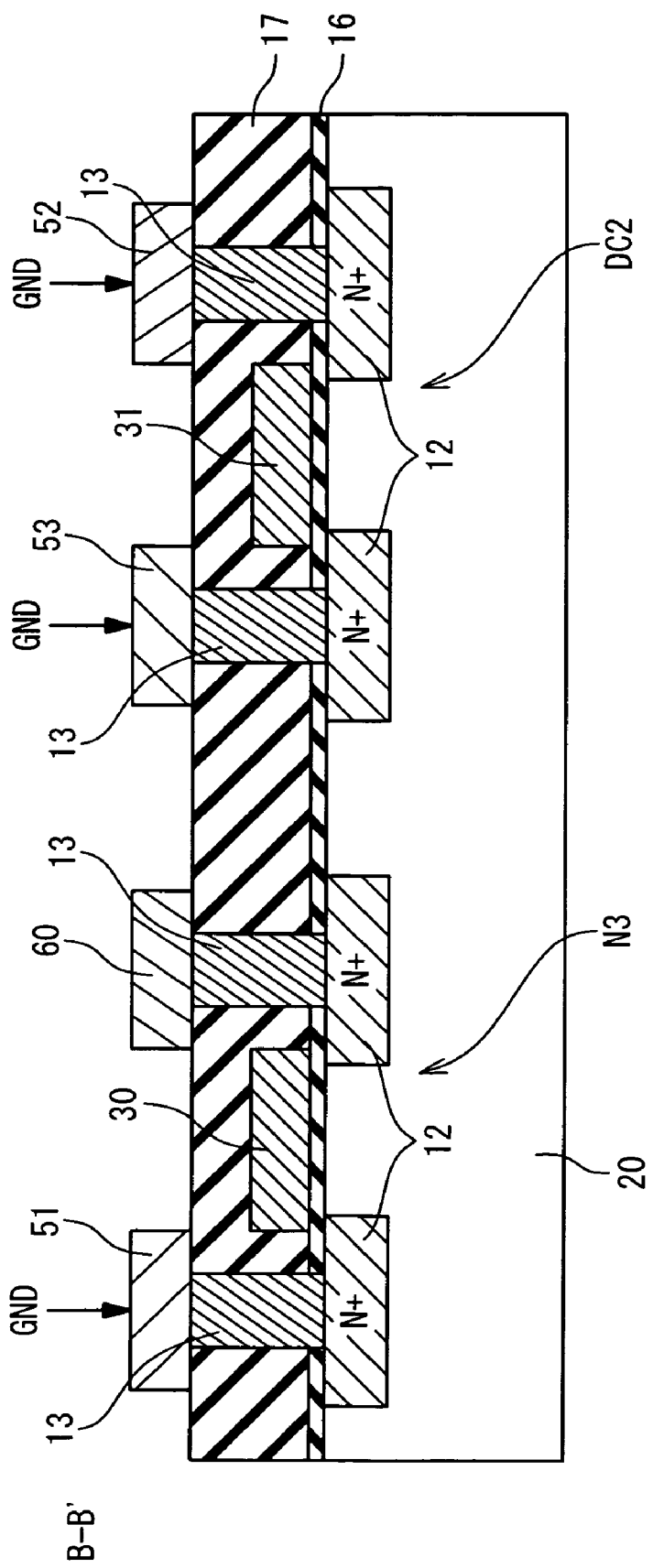
FIG. 4 is a section view illustrating the structure of the semiconductor device on the B-B' section indicated in FIG. 2A.

The invention will be now described herein with reference to illustrative embodiments. Those skilled in the art would recognize that many alternative embodiments can be accomplished using the teachings of the present invention and that the invention is not limited to the embodiments illustrated for explanatory purposed.

First Embodiment

FIGS. 2A and 2B illustrate a layout of a semiconductor device in a first embodiment of the present invention. In detail, FIG. 2A illustrates layouts of a well layer, a diffusion layer, a polysilicon layer, and a contact layer, which are integrated within or on the substrate, and FIG. 2B illustrates a metal interconnection layer integrated on or over these layers.

Referring to FIG. 2A, the semiconductor device in this embodiment is composed of a circuit region, decoupling capacitor regions, and tap regions 90 and 91. An array of CMOS primitive cells are provided within the circuit region. In this embodiment, the CMOS primitive cells include CMOS inverter cells, each including a PMOS transistor and an NMOS transistor. The tap regions 90 and 91 are provided to stabilize of the electric potential of the wells of the transistors within the CMOS primitive cells.

As shown in FIG. 2B, the semiconductor device is composed of a power supply line 40 and a ground line 50, which are extended in the X-axis direction. The power supply line 40 is connected to the power supply VDD, and the ground line 50 is connected to the ground GND. The power supply line 40 is extended along the array of the PMOS transistors within the CMOS primitive cells, and the ground line 50 is extended along the array of the NMOS transistors.

Integrated within the array of the CMOS inverter cells are PMOS transistors P1, P2, P3, NMOS transistors N1, N2, and N3. It should be noted that the CMOS inverter cells a sort of CMOS primitive cells. In a CMOS inverter cell, one PMOS transistor and one NMOS transistor within circuit region constitute a CMOS inverter. For example, the PMOS transistor P1 and the NMOS transistor N1 have a commonly-connected gate electrode 30, and the drains thereof being commonly connected through an interconnection 60. Such connection allows the PMOS transistor P1 and the NMOS transistor N1 to function as a CMOS inverter. The same goes for the PMOS transistors P2, P3, NMOS transistors N2, and N3.

FIG. 3 is a section view illustrating the structure on the section A-A' indicated in FIG. 2A. The PMOS transistor P3 is composed of a pair of P-type diffusion layers 11 integrated within an N-well 10, and the commonly connected gate 30. One of the P-type diffusion layers 11 is used as the source of the PMOS transistor P3, and the other is used as the drain. The source of the PMOS transistor P3 is connected to the power supply line 40 through via contacts 13 and an interconnection 41, and fed with the power supply voltage VDD.

FIG. 4 is a section view illustrating the structure on the section B-B' indicated in FIG. 2A. The NMOS transistor N3 is composed of a pair of N-type diffusion layers 12 integrated within a P-well 20, and the commonly connected gate 30. One of the N-type diffusion layers 11 is used as the source of the NMOS transistor N3, and the other is used as the drain. The source of the NMOS transistor N3 is connected to the ground line 50 through via contacts 13 and an interconnection 51, and fed with the ground level voltage GND. As shown in FIG. 2A, the PMOS transistor P3 and the NMOS transistor n3 are connected with each other through via contacts 13 and an interconnection 60. In this embodiment, the circuit region includes three CMOS inverter cells thus structured. It should be noted that the number of the CMOS inverter cells integrated within the circuit region is not limited to three.

The decoupling capacitors within the semiconductor device in this embodiment includes MOS gate capacitors formed of unused MOS transistors integrated within the circuit region, and MOS gate capacitors integrated within the decoupling capacitor regions under the power supply line 40 and the ground line 50. The decoupling capacitor regions are positioned between the tap regions 90, 91 and the circuit region.

Specifically, the decoupling capacitor cell integrated within the circuit region includes a PMOS transistor DC1 positioned adjacent to the PMOS transistor P3, and an NMOS transistor DC20 positioned adjacent to the NMOS transistor N3. With reference to FIG. 3, the PMOS transistor DC1 is composed of P-type diffusion layers 11 integrated within the N-well 10 and a gate electrode 31. The gate electrode 31 is connected to the ground line 50 through via contacts 13 and an interconnection 52. The P-type diffusion layers 11 are used as the source and drain of the PMOS transistor DC1, and connected to the power supply line 40 through via contacts 13, interconnections 42 and 43. Accordingly, the source and drain of the PMOS transistor DC1 are fed with the power supply voltage VDD, while the gate thereof is fed with the ground level voltage GND.

Correspondingly, as shown in FIG. 4, the NMOS transistor DC2 is composed of N-type diffusion layers 12 integrated within the P-well 20, and a gate electrode 32. The gate electrode 32 is connected to the power supply line 40 through via contacts 13 and an interconnection 42. The N-type diffusion layers 12 are used as the source and drain of the NMOS transistor DC2, and connected to the ground line 50 through via contacts 13, interconnections 52 and 53. Accordingly, the source and drain of the PMOS transistor DC2 are fed with the ground level voltage GND, while the gate thereof is fed with the power supply voltage VDD.

Figure 7:
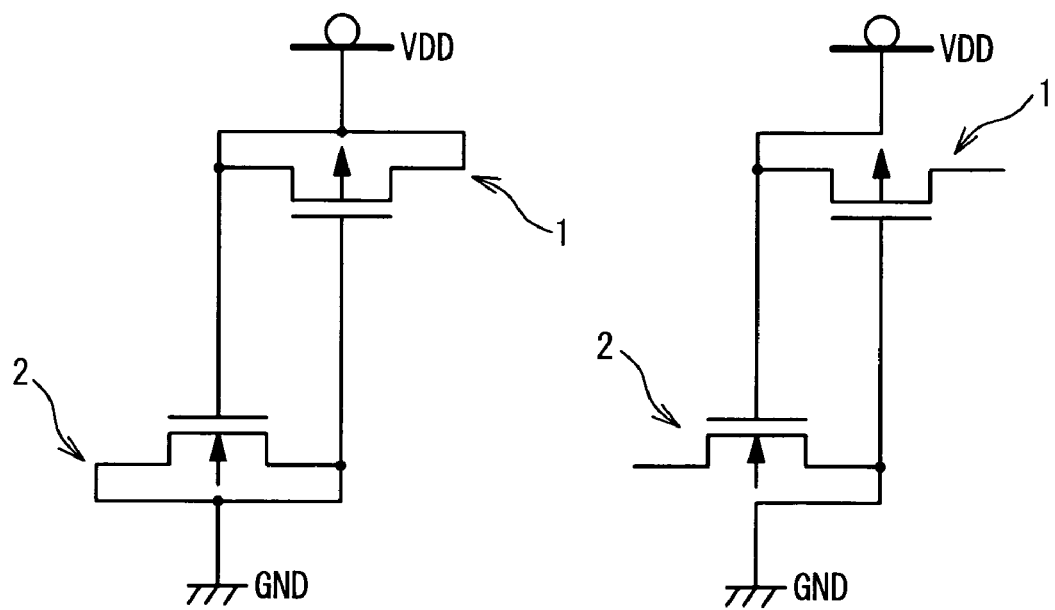
FIGS. 7A and 7B are equivalent circuit diagrams of the decoupling capacitors.

The PMOS transistor DC1 and the NMOS transistor DC2 integrated within the decoupling capacitor cell function as a MOS gate capacitor pair as shown in FIG. 7A, composed of a PMOS transistor 1 and an NMOS transistor 2, the PMOS transistor 1 having a source and drain connected to the power supply VDD and a gate connected to the ground GND, and a NMOS transistor, and the NMOS transistor 2 having a source and drain connected to the ground GND and a gate connected to the power supply VDD.

The gate capacitances of the PMOS transistor DC1 and the NMOS transistor DC2 integrated within the decoupling capacitor cell effectively provides suppression of the power supply noise of the power supply VDD and the ground GND, which are connected to the circuit region. It should be noted that only one of the source and drain of the PMOS transistor DC1 may be connected to the power supply line 40 through the via contacts 13. Correspondingly, only one of the source and drain of the NMOS transistor DC2 may be connected to the ground line 50 through the via contacts 13. In this case, as shown in FIG. 7B, one of the source and drain of each PMOS transistor DC1 is left open.

Figure 5:
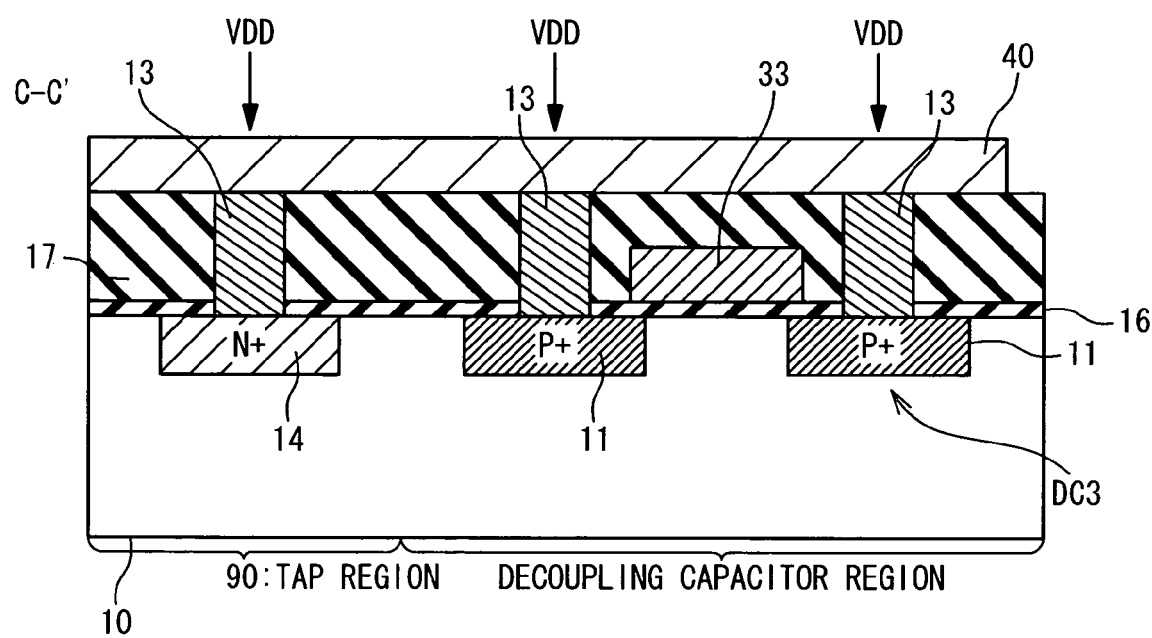
FIG. 5 is a section view illustrating the structure of the semiconductor device on the C-C' section indicated in FIG. 2A.

A PMOS transistor DC3 is integrated within the decoupling capacitor region under the power supply line 40, and an NMOS transistor DC4 is integrated within the decoupling capacitor region under the ground line 50. FIG. 5 is a section view illustrating the structure on the C-C' section indicated in FIG. 2A. As shown in FIG. 5, the PMOS transistor DC3 is composed of a gate electrode 33, and a pair of P-type diffusion layers 11 integrated within the N-well 10. As shown in FIG. 2A, the gate electrode 33 is electrically to the ground line 50 connected through the gate electrode 31 and the interconnection 52. The gate electrode 33 is positioned under the power supply line 40, and extended in the same direction of the power supply line 40. The P-type diffusion layers 11 are used as the source and drain of the PMOS transistor DC3, and connected to the power supply line 40 through via contacts 13. Accordingly, the source and drain of the PMOS transistor DC3 are fed with the power supply voltage VDD, and the gate electrode thereof is fed with the ground level voltage GND.

Figure 6:
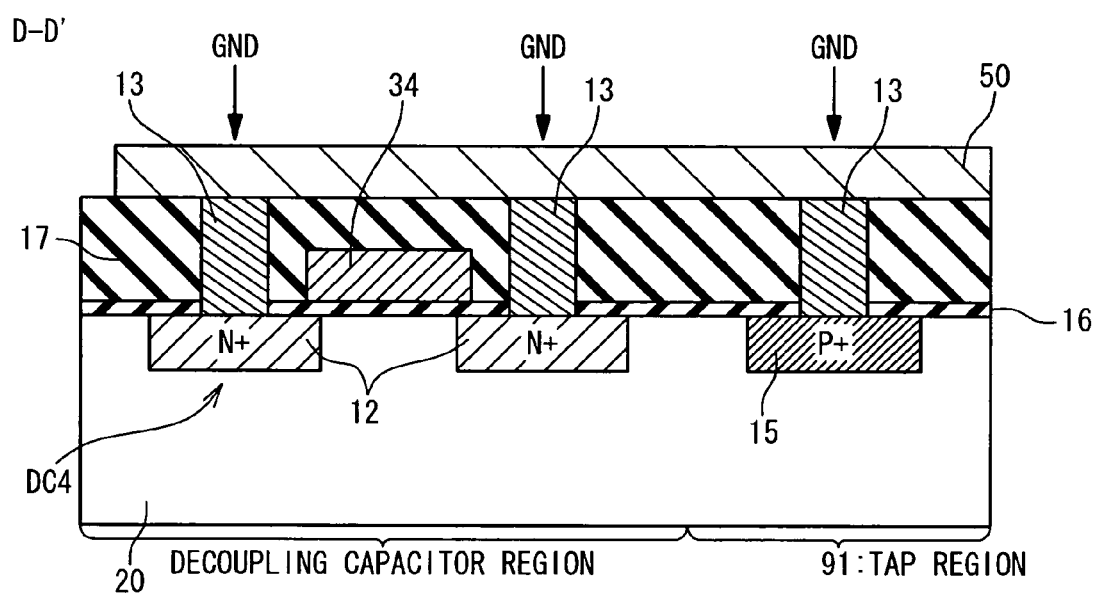
FIG. 6 is a section view illustrating the structure of the semiconductor device on the D-D' section indicated in FIG. 2A.

FIG. 6 is a section view illustrating the structure on the D-D' section indicated in FIG. 2A. As shown in FIG. 6, the NMOS transistor DC4 is composed of a gate electrode 34, and a pair of N-type diffusion layers 12 integrated within the P-well 20. As shown in FIG. 2A, the gate electrode 34 is electrically connected to the power supply line 40 through the gate electrode 32, and the interconnection 42. The gate electrode 34 is positioned under the ground line 50, and extended in the same direction of the ground line 50. The N-type diffusion layers 12 are used as the source and drain of the NMOS transistor DC4, and connected to the ground line 50 through via contacts 13. Accordingly, the source and drain of the NMOS transistor DC4 are fed with the ground level voltage GND, and the gate electrode thereof is fed with the power supply voltage VDD.

The PMOS transistor DC3 and the NMOS transistor DC4 integrated within the decoupling capacitor regions under the power supply line 40 and the ground line 50 function as a MOS gate capacitor pair shown in FIG. 7A; the MOS gate capacitor is composed of a PMOS transistor 1 and an NMOS transistor 2, the PMOS transistor 1 having the source and drain connected to the power supply VDD and the gate connected to the ground GND, and the NMOS transistor 2 having the source and drain connected to the ground GND and the gate connected to the power supply VDD.

Accordingly, the PMOS transistor DC3 and the NMOS transistor DC4, integrated within the decoupling capacitor regions under the power supply line 40 and the ground line 50, effectively reduces the power supply noise of the power supply VDD and the ground GND.

The tap region 90 is positioned under the power supply line 40, which is connected to the power supply VDD. With reference to FIG. 5, the tap region 90 is provided with an N-type diffusion layer 14 and via contacts 13. The N-type diffusion layer 14 provides an electrical connection between the N-well 10 and the power supply VDD. The tap region 90 thus structured effectively stabilizes the potential of the N-well 10.

Correspondingly, the tap region 91 is positioned under the ground line 50, which is connected to the ground GND. With reference to FIG. 5, the tap region 91 is provided with a P-type diffusion layer 15 and via contacts 13. The P-type diffusion layer 15 provides an electrical connection between the P-well 20 and the ground GND. The tap region 91 thus structured effectively stabilizes the potential of the P-well 20.

One feature of the semiconductor device in this embodiment is to achieve an increased total gate area of MOS gate capacitors used as the decoupling capacitors by using the PMOS and NMOS transistors DC3 and DC4 integrated under the power supply line 40 and the ground line 50. The semiconductor device in this embodiment uses the gates of the unused MOS transistors within the circuit region as the decoupling capacitors. Additionally, the semiconductor device in this embodiment uses the gate capacitances of the MOS transistors integrated under the power supply line 40 and the ground line 50 as the decoupling capacitors. This effectively increases the total capacitance of the decoupling capacitors with a reduced chip size. Therefore, the semiconductor device in this embodiment effectively suppresses the power supply noise with a reduced chip size.

Second Embodiment

Figure 8:
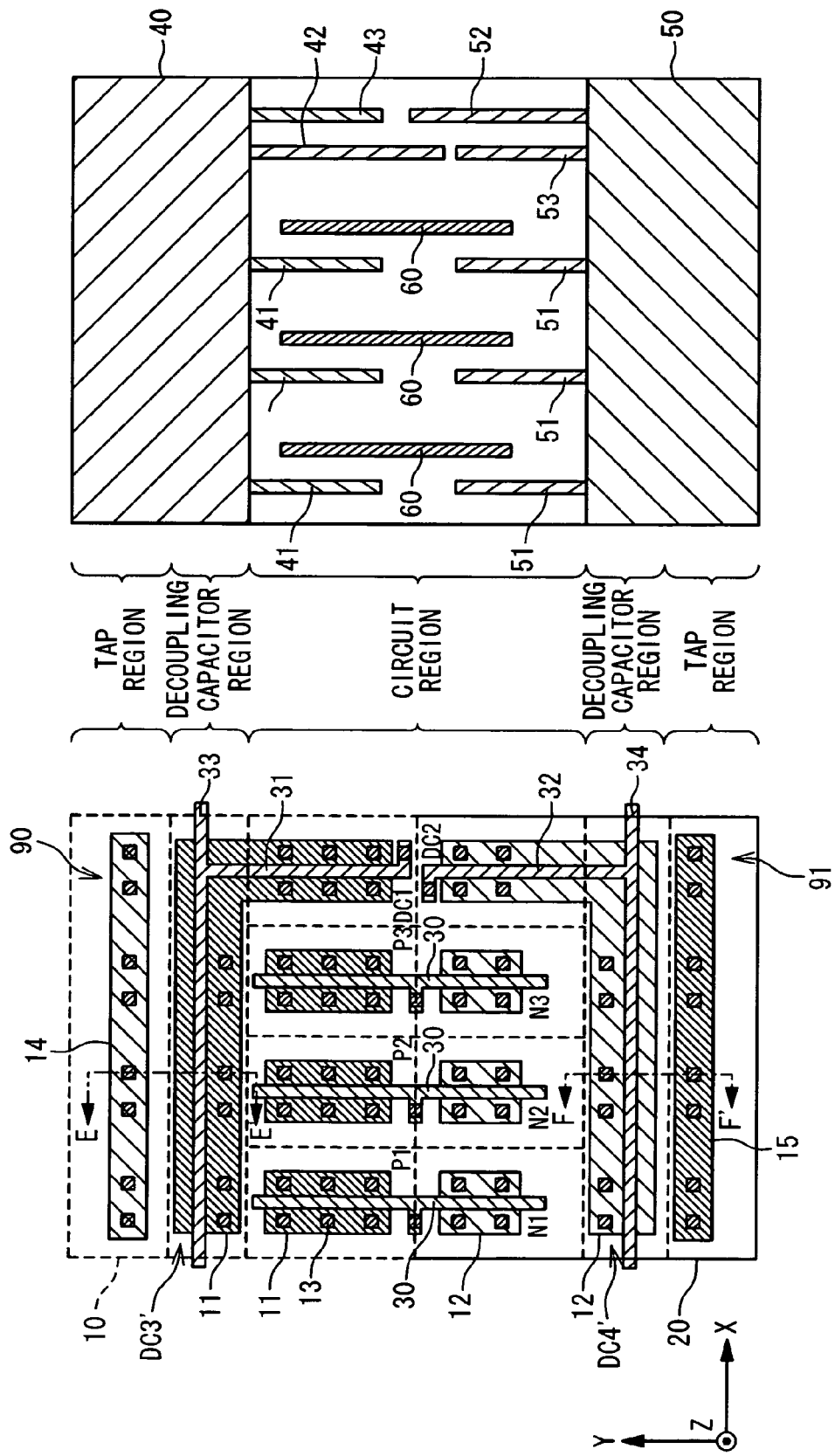
FIGS. 8A and 8B illustrate a layout of a semiconductor device in a second embodiment of the present invention.

FIGS. 8A and 8B illustrates a layout of a semiconductor device in a second embodiment of the present invention. In this embodiment, a PMOS transistor DC3' and an NMOS transistor DC4' are integrated under the power supply line 40 and the ground line 50, respectively, in place of the PMOS transistor DC3 and the NMOS transistor DC4 in the first embodiment.

Figure 9:
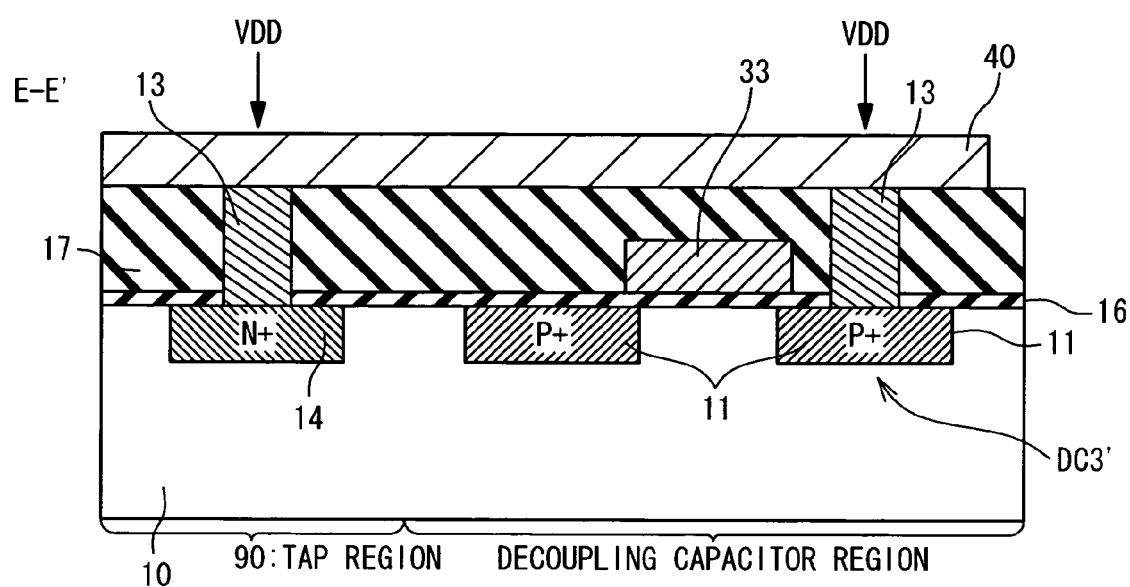
FIG. 9 is a section view illustrating the structure of the semiconductor device on the E-E' section indicated in FIG. 8A.

FIG. 9 is a section view illustrating the structure on the section E-E' indicated in FIG. 8A. The PMOS transistor DC3' is composed of a gate electrode 33 and a pair of P-type diffusion layers 11 integrated within the N-well 10. The gate electrode 33 is electrically connected to the ground line 50 through the gate electrode 31 and the interconnection 52. One of the P-type diffusion layers 11 is used as the source of the PMOS transistor DC3', and the other is used as the drain thereof. With respect to the PMOS transistor DC3', only one of the P-type diffusion layers 11 is connected to the power supply line 40 through via contacts 13, the one being located near the side of the circuit region. In other words, only one of the source and drain of the PMOS transistor DC3' is fed with the power supply voltage VDD, and the gate electrode 33 is fed with the ground level voltage GND.

Figure 10:
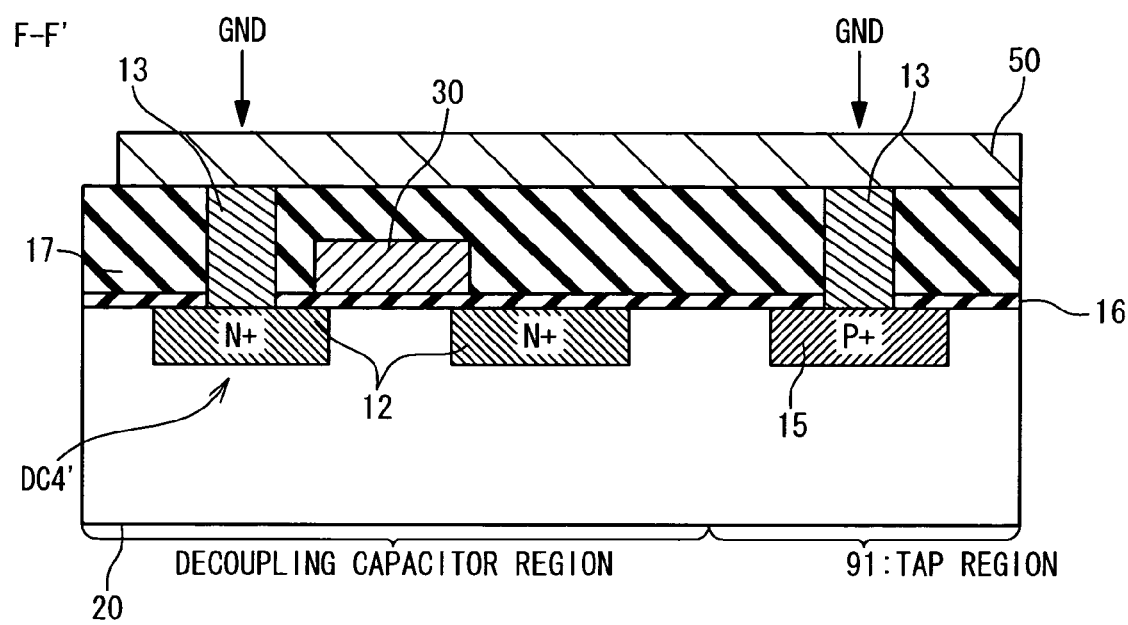
FIG. 10 is a section view illustrating the structure of the semiconductor device on the F-F' section indicated in FIG. 8A.

FIG. 10 is a section view illustrating the structure on the section F-F' indicated in FIG. 8A. The PMOS transistor DC4' is composed of a gate electrode 34 and a pair of N-type diffusion layers 12 integrated within the P-well 20. The gate electrode 34 is electrically connected to the power supply line 40 through the gate electrode 33 and the interconnection 42. One of the N-type diffusion layers 12 is used as the source of the NMOS transistor DC4', and the other is used as the drain thereof. With respect to the NMOS transistor DC4', only one of the N-type diffusion layers 12 is connected to the ground line 50 through via contacts 13, the one being located near the side of the circuit region. In other words, only one of the source and drain of the PMOS transistor DC4' is fed with the ground level voltage GND, and the gate electrode 33 is fed with the power supply voltage VDD.

The PMOS transistor DC3' and the NMOS transistor DC4' integrated within the decoupling capacitor regions under the power supply line 40 and the ground line 50 function as a MOS gate capacitor pair shown in FIG. 7B; the MOS gate capacitor is composed of a PMOS transistor 1 and an NMOS transistor 2, the PMOS transistor 1 having only one of the source and drain connected to the power supply VDD and the gate connected to the ground GND, and the NMOS transistor 2 having only one of the source and drain connected to the ground GND, and the gate connected to the power supply VDD.

The layout of the semiconductor device in the second embodiment is especially useful for the case that the areas of the decoupling capacitor regions, located between the circuit region and the tap regions 90 and 91, are not so large to provide many via contacts 13 on the P-type diffusion regions 11 of the PMOS transistor DC3', and on the N-type diffusion regions 12 of the NMOS transistor DC4'.

Third Embodiment

FIGS. 11A and 11B illustrate the layout of a semiconductor device in a third embodiment of the present invention. In the third embodiment, the N-type diffusion layer 12 within the tap region 90 is connected to a power supply line separated from the power supply line 40 connected to the CMOS primitive cells within the circuit region. Correspondingly, the P-type diffusion layer 15 within the tap region 91 is connected to a ground line separated from the ground line 50 connected the CMOS primitive cells within the circuit region.

Specifically, as shown in FIG. 11A, the layouts of the well layer, the diffusion layer, the polysilicon layer, and the contact layer are identical to those shown in FIG. 2A.

The difference is that a power supply line 80 and a ground line 90 are provided in addition to the power supply line 40 and the ground line 50, as shown in FIG. 11B. In the third embodiment, the power supply line 40 and the ground line 50 are formed to cover only the decoupling capacitor regions. The power supply line 80 is located over the tap region 90 and extended along the power supply line 40. Correspondingly, the ground line 90 is located over the tap region 91, and extended along the ground line 50.

The layout shown in FIGS. 11A and 11B effectively shields the circuit region from substrate noise. This results from the arrangement in which the tap regions 90 and 91 are connected to the power supply line 70 and ground line 80, and separated from the power supply VDD and the ground GND connected to the CMOS primitive cells within the circuit region. The shielding from the substrate noise is especially important in the case when the LSI incorporates analog circuits susceptive to the substrate noise in addition to digital circuits. It should be noted that the PMOS and NMOS transistors used as the decoupling capacitors have one of the source and drain disconnected from the power supply VDD or the ground GND, as shown in FIG. 8A.

In summary, the semiconductor device in accordance with the present invention achieves effective suppression of the power supply noise with a reduced chip size, through making effective use of spaces under the power supply line and the ground line to provide an increased gate area of MOS gate capacitors; the semiconductor device incorporates the MOS gate capacitors used as the decoupling capacitors under the spaces under the power supply line and the ground line. Therefore, the semiconductor device in accordance with the present invention effectively avoids the malfunction and operating speed reduction due to the power supply noise. The architecture of in accordance with the present invention is especially effective for improving tolerance to power supply noise within LSI's incorporating both of analog and digital circuits, which are susceptive to power supply noise.

It is apparent that the present invention is not limited to the above-described embodiments, which may be modified and changed without departing from the scope of the invention.

For example, various CMOS cells, such as NAND gate cells, NOR gate cells, AND gate cells, OR gate cells, flipflop cells and combinations thereof, may be used as the CMOS primitive cells provided within the circuit region.

Additionally, in an alternative embodiment, the tap regions 90 and 91 may be located between the decoupling capacitor regions and the circuit region, as shown in FIGS. 12A and 12B. In this case, as shown in FIG. 12A, the N-type diffusion layer 14 is located adjacent to the PMOS transistors P1, P2, and P3 within the N-well 10 and connected to the power supply line 40 through via contacts 13. The electrical connection between N-type diffusion layer 14 and the power supply line 40 effectively stabilizes the electric potential of the N-well 10. Correspondingly, the P-type diffusion layer 15 is located adjacent to the NMOS transistors N1, N2, and N3 within the P-well 20 and connected to the ground line 50 through via contacts 13. The electrical connection between the P-type diffusion layer 15 and the ground line 50 effectively stabilizes the electric potential of the P-well 20. The layout of the metal interconnection layer is unchanged as shown in FIG. 12B.

What is claimed is:

1. The semiconductor device comprising:
    an array of CMOS primitive cells provided in a circuit region;
    a first power supply line extended along said array of said CMOS primitive cells and connected to the CMOS primitive cells;
    a first ground line extended along said array of said CMOS primitive cells and connected to the CMOS primitive cells;
    a first decoupling capacitor provided under said power supply line;
    a second decoupling capacitor provided under said ground line,
        wherein said first decoupling capacitor is formed of a first PMOS transistor having a gate connected to said first ground line, at least one of a source and drain of said first PMOS transistor being connected to said first power supply line, and wherein said second decoupling capacitor is formed of a first NMOS transistor having a gate connected to said first power supply line, at least one of a source and drain of said first NMOS transistor being connected to said first ground line:

a second power supply line extended along said first power supply line and fixing an electrical potential of an N-well;

a second ground line extended along said first ground line and fixing an electrical potential of a P-well: and an N-type diffusion layer provided under said second power supply line, and connecting said N-well to said second power supply line; and a P-type diffusion layer provided under said second ground line, and connecting said P-well to said second ground line, and wherein said N-type diffusion layer is positioned between said first decoupling capacitor and said array of said CMOS primitive cells, and said P-type diffusion layer is positioned between said second decoupling capacitor and said array of said CMOS primitive cells.

* * * * *